(12) United States Patent  
Lin et al.

(10) Patent No.: US 8,941,224 B2  
(45) Date of Patent: Jan. 27, 2015

(54) PACKAGE STRUCTURE OF A CHIP AND A SUBSTRATE

(71) Applicant: Kinsus Interconnect Technology Corp., Taoyuan (TW)

(72) Inventors: Ting-Hao Lin, Taipei (TW); Yu-Te Lu, Taoyuan Hsien (TW); De-Hao Lu, Taoyuan County (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 0 days.

(21) Appl. No.: 13/853,281

(22) Filed: Mar. 29, 2013

(65) Prior Publication Data

US 2014/0291853 A1 Oct. 2, 2014

(51) Int. Cl.
*H01L 23/06* (2006.01)
*H01L 23/498* (2006.01)

(52) U.S. Cl.
CPC ... *H01L 23/49827* (2013.01); *H01L 2924/0002* (2013.01); *H01L 2224/16225* (2013.01); *H01L 2224/32225* (2013.01); *H01L 2224/73204* (2013.01)
USPC .............................. 257/684; 438/118; 438/124

(58) Field of Classification Search
CPC ............. H01L 2224/3225; H01L 2224/16225; H01L 2224/73204; H01I 2924/00; H01I 2924/00014
USPC ......... 438/106, 118, 119, 121, 124, 125, 126, 438/127; 257/684, 774, 789, 795
See application file for complete search history.

(56) References Cited

U.S. PATENT DOCUMENTS

| | | | |
|---|---|---|---|
| 6,696,764 B2 * | 2/2004 | Honda | 257/778 |
| 6,933,173 B2 * | 8/2005 | Yunus | 438/110 |
| 2011/0140105 A1 * | 6/2011 | Maruyama et al. | 257/48 |
| 2012/0126395 A1 * | 5/2012 | Lee et al. | 257/737 |
| 2013/0334714 A1 * | 12/2013 | Park et al. | 257/787 |

* cited by examiner

*Primary Examiner* — Zandra Smith
*Assistant Examiner* — John M Parker
(74) *Attorney, Agent, or Firm* — Lin & Associates IP, Inc.

(57) ABSTRACT

A package structure includes a thin chip substrate, a stabilizing material layer, a chip and a filling material. A first circuit metal layer of the substrate is inlaid into a dielectric layer and a co-plane is defined by the first circuit metal layer and the dielectric layer and is exposed from the dielectric layer. The bonding pads of the substrate are on the co-plane, have a height higher than the co-plane and connected to the first circuit metal layer. The stabilizing material layer is provided on two sides of the co-plane to define a receiving space for accommodating the chip. The filling material is injected into the receiving space to fasten the pins of the chip securely with bonding pads. Since no plastic molding is required, a total thickness of the package structure and the cost is reduced. The stabilizing material layer prevents the substrate from warping and distortion.

4 Claims, 2 Drawing Sheets

PACKAGE STRUCTURE OF A CHIP AND A SUBSTRATE

BACKGROUND OF THE INVENTION

1. Field of the Invention

The present invention generally relates to a package structure of a chip and a substrate and more specifically to formation of a stabilizing structure on the thin chip substrate in order to fasten the chip securely thereon.

2. The Prior Arts

As shown in FIG. 1, a traditional package structure for the chip and the substrate includes a thin chip substrate 1, a chip 50, a filling material 60 and a plastic molding material 90 and the thin chip substrate 1 includes a first circuit metal layer 16, a second circuit metal layer 18 and a dielectric layer 30.

Specifically, the first circuit metal layer 16 is inlaid into the dielectric layer 30 to form a co-plane. The second circuit metal layer 18 is formed on the dielectric layer 30 to fill up the holes in the dielectric layer 30 so as to connect electrically with the first circuit metal layer 16. The thin chip substrate 1 further includes a plurality of bonding pads 24 with a height higher than the co-plane connected to the first circuit metal layer 16, and a solder resist layer 20 covering the other side of the dielectric layer 30 and part of the second circuit metal layer 18.

The chip 50 has pins 52 connected to the bonding pads 24. The filling material 60 is injected into the part under the chip 50, which is connected to the bonding pads 24 via pins 52. Finally, the chip 50 and the thin chip substrate 1 are enclosed by the plastic molding material 90.

However, one of the shortcomings of the package structure in the prior arts is that the thin chip substrate has a thickness ranging from 70 to 150 μm, and the thin chip substrate and the chip package are generally produced by various companies using different processes. Further, the thin chip substrate is relatively thin and is easily warped, distorted or deformed during the process of transportation, injecting the filling material or enclosing by the plastic molding material. Consequently, the circuit design is greatly limited due to the offset loss in term of compensation, and no finer line width can be created.

Additionally, this package structure has a thickness of about 1.2 mm to 2.0 mm, which is obviously not able to meet the modern requirements of the electronic device, such as thinner and lighter. The cost of the package structure is also high because the plastic molding material is expensive such that it is hard to compete in the market.

Therefore, it is needed to provide a new package structure for effectively packaging the chip and the thin chip substrate to help designing much finer and thinner circuit to overcome the above problems in the prior arts.

SUMMARY OF THE INVENTION

The primary objective of the present invention is to provide a package structure of a chip and a substrate, which includes a thin chip substrate, a stabilizing material layer, a chip and a filling material. Further, the thin chip substrate includes a first circuit metal layer, a second circuit metal layer, a solder resist layer, bonding pads and a dielectric layer. The first circuit metal layer is inlaid into the dielectric layer and defines a co-plane in corporation with the dielectric layer and the co-plane is exposed from the dielectric layer. The dielectric layer has holes with respect to the first circuit metal layer. The second circuit metal layer is formed on the dielectric layer to fill up the holes to be connected electrically to the first circuit metal layer. The bonding pads are on the co-plane, have a height higher than the co-plane and connected to the first circuit metal layer. The solder resist layer is formed on the dielectric layer to cover part of the second circuit metal layer.

The stabilizing material layer is provided on two sides of the co-plane to define a receiving space for accommodating the chip having pins to be soldered with the bonding pads. Additionally, the stabilizing material layer includes an adhesive layer and a stabilizing layer on the adhesive layer so as to stabilize the thin chip substrate to prevent it from warping and distortion. The chip has pins, and each is soldered with a respective one of the bonding pads. The filling material is injected into the receiving space under the chip to fasten the pins of the chip and the bonding pads securely. Therefore, the resulting thickness of the package structure has a thickness ranging from 300 to 850 μm since no traditional plastic molding process is required.

The thickness of the package structure is greatly reduced at much lower cost since no plastic molding is required. Moreover, the stabilizing material layer prevents the thin chip substrate from warping and distortion such that no compensation is needed and it is thus possible to implement much finer and densely located circuit.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
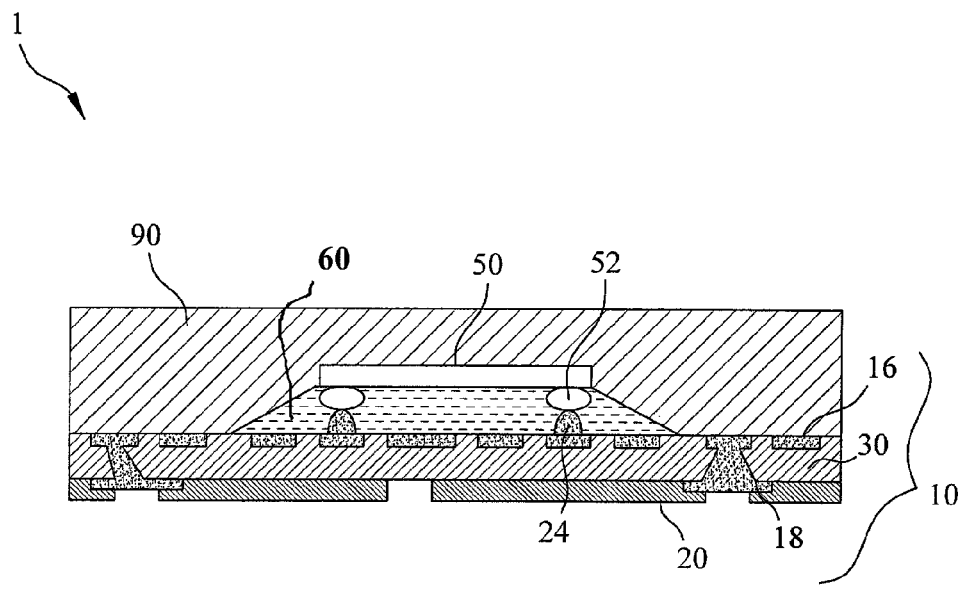
FIG. 1 is a cross-sectional view showing a prior art package structure of a chip and a substrate.
Figure 2:
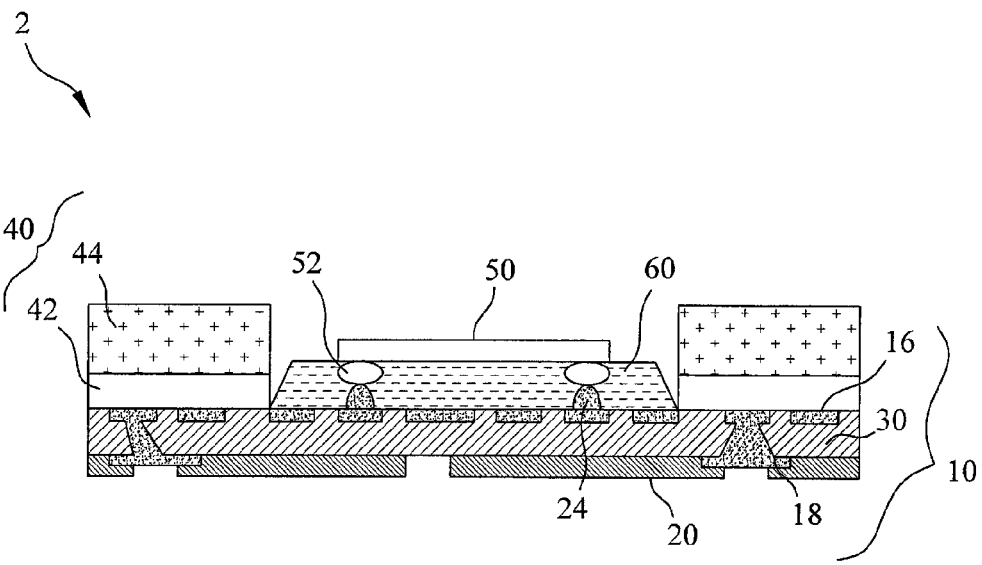
FIG. 2 is a cross-sectional view showing one embodiment of a package structure of a chip and a substrate according to the present invention.

FIG. 2 is a cross-sectional view showing one embodiment of a package structure 2 of a chip and a substrate according to the present invention. As shown in FIG. 2, the package structure 2 of the present invention includes a thin chip substrate 10, a stabilizing material layer 40, a chip 50 and a filling material 60. The thin chip substrate 10 includes a first circuit metal layer 16, a second circuit metal layer 18, a solder resist layer 20, a plurality of bonding pads 24 and a dielectric layer 30.

The first circuit metal layer 16 is inlaid into the dielectric layer 30 such that a co-plane is defined by the first circuit metal layer 16 and the dielectric layer 30 and is exposed from the dielectric layer 30. The dielectric layer 30 has a plurality of holes with respect to the first circuit metal layer 16. The second circuit metal layer 18 is formed on the dielectric layer 30 to fill up the holes such that the second circuit metal layer 18 is connected electrically to the first circuit metal layer 16. The bonding pads 24 are on the co-plane, have a height higher than the co-plane and are connected to the first circuit metal layer 16. The solder resist layer 20 is formed on the dielectric layer 30 to cover parts of the second circuit metal layer 18.

The stabilizing material layer 40 is provided on two opposite sides of the co-plane of the thin chip substrate 10 to define a receiving space for accommodating the chip 50. The stabilizing material layer 40 includes an adhesive layer 42 and a stabilizing layer 44 on the adhesive layer 42. The stabilizing layer 44 is formed from glass fiber, plastic or stainless steel. As shown in FIG. 2, the chip is disposed in the receiving space and the stabilizing layer 44 is higher than the top of the chip 50. The stabilizing material layer 40 can stabilize the thin chip substrate 10 to prevent it from warping and distortion.

The chip has the pins 52, each soldered with a respective one of the bonding pads 24. The filling material 60 is injected into the receiving space under the chip 50 to fasten the pins 52 of the chip 50 and the bonding pads 24 securely. Therefore, the resulting thickness of the package structure 2 has a thickness ranging from 300 to 850 μm without the traditional plastic molding.

Figure 3:
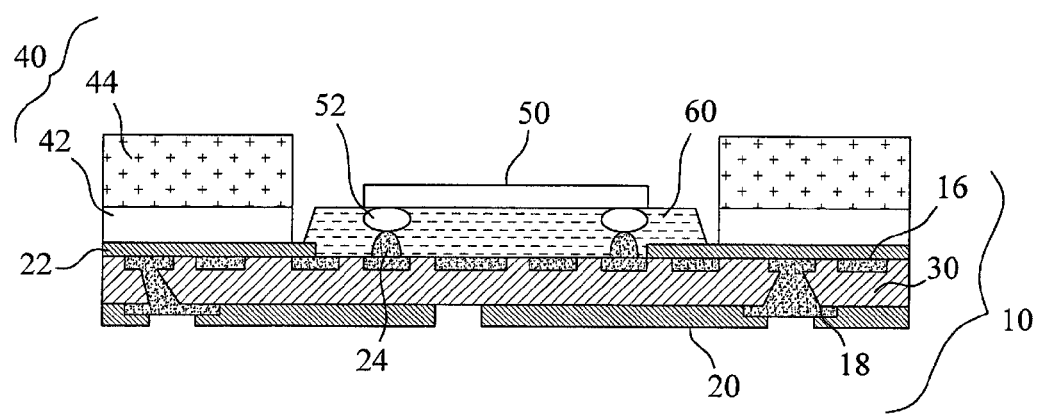
FIG. 3 is a cross-sectional view showing another embodiment of the package structure of a chip and a substrate according to the present invention.

FIG. 3 is a cross-sectional view showing another embodiment of the package structure 3 of a chip and a substrate according to the present invention. As shown in FIG. 3, the package structure 3 of the present invention is generally similar to the above package structure 2 in FIG. 2. The primary difference resides in that the package structure 3 further includes a second solder resist layer 22 provided on the co-plane, which covers part of the co-plane but not the bonding pads 24. The stabilizing material layer 40 is formed on the second solder resist layer 22. Similar to FIG. 2, the filling material 60 is injected into the receiving space under the chip 50 to further fasten the pins 52 of the chip 50 and the bonding pads 24.

One aspect of the present invention is that the thickness of the package structure is greatly reduced at much lower cost without the plastic molding. Moreover, the stabilizing material layer prevents the thin chip substrate from warping and distortion such that it is thus possible to implement much finer and densely circuit layout without the need of consideration of compensation for warping and distortion.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A package structure of a chip and a substrate, comprising:
   a thin chip substrate having a first circuit metal layer, a second circuit metal layer, bonding pads and a dielectric layer, wherein the first circuit metal layer is inlaid into the dielectric layer to cooperatively define a co-plane exposed from the dielectric layer, the dielectric layer having a plurality of holes with respect to the first circuit metal layer, the second circuit metal layer being formed on the dielectric layer to fill up the holes to be connected electrically to the first circuit metal layer, the bonding pads connected to the first circuit metal layer being formed on the co-plane;
   a stabilizing material layer provided on two sides of the co-plane to define a receiving space, wherein the stabilizing material layer includes a stabilizing layer formed on an adhesive layer with the adhesive layer disposed between the stabilizing layer and the co-plane;
   a chip having pins, each soldered with a respective one of the bonding pads; and
   a filling material injected into the receiving space under the chip to fasten the pins of the chip and the bonding pads, wherein the package structure has a total thickness ranging from 300 to 850 μm;
   wherein the stabilizing layer has a top higher than the chip.

2. The package structure as claimed in claim 1, wherein the thin chip substrate further includes a solder resist layer covering a surface of the dielectric layer and part of the second circuit metal layer.

3. The package structure as claimed in claim 1, wherein the stabilizing layer is formed of glass fiber, plastic or stainless steel.

4. The package structure as claimed in claim 1, wherein the thin chip substrate further includes a solder resist layer covering the co-plane but not the bonding pads, and the stabilizing material layer is disposed on the solder resist layer.

* * * * *